US012776367B2

(12) United States Patent
Yin et al.

(10) Patent No.: US 12,776,367 B2
(45) Date of Patent: Oct. 27, 2026

(54) VOLTAGE REPLICA CIRCUITS FOR RRAM-BASED CROSSBAR CIRCUITS

(71) Applicant: TetraMem Inc., Fremont, CA (US)

(72) Inventors: Wenbo Yin, Alameda, CA (US); Hengfang Zhu, Fremont, CA (US)

(73) Assignee: TetraMem Inc., San Jose, CA (US)

( * ) Notice: Subject to any disclaimer, the term of this patent is extended or adjusted under 35 U.S.C. 154(b) by 0 days.

(21) Appl. No.: 18/735,113

(22) Filed: Jun. 5, 2024

(65) Prior Publication Data

US 2025/0378878 A1 Dec. 11, 2025

(51) Int. Cl.
*G11C 13/00* (2006.01)
*G11C 7/16* (2006.01)

(52) U.S. Cl.
CPC .............. *G11C 13/004* (2013.01); *G11C 7/16* (2013.01); *G11C 13/0026* (2013.01); *G11C 13/003* (2013.01); *G11C 2013/0042* (2013.01); *G11C 2013/0045* (2013.01)

(58) Field of Classification Search
CPC . G11C 13/004; G11C 7/16; G11C 2013/0042; G11C 2013/0045
USPC .......................................................... 365/148
See application file for complete search history.

(56) References Cited

U.S. PATENT DOCUMENTS

| | | | | |
|---|---|---|---|---|
| 2014/0092671 | A1 | 4/2014 | Azuma et al. | |
| 2016/0019963 | A1 | 1/2016 | Yan | |
| 2018/0358091 | A1 | 12/2018 | Chou | |
| 2019/0080753 | A1 | 3/2019 | Tran et al. | |
| 2022/0277790 | A1 | 9/2022 | Terada et al. | |
| 2022/0366976 | A1* | 11/2022 | Hwang | G11C 5/147 |
| 2023/0038384 | A1* | 2/2023 | Hwang | G11C 13/0026 |
| 2023/0260574 | A1* | 8/2023 | Portal | G11C 13/004 365/163 |
| 2023/0298663 | A1* | 9/2023 | Chun | G11C 11/54 |
| 2024/0021242 | A1* | 1/2024 | Park | G11C 13/0026 |
| 2024/0153554 | A1 | 5/2024 | Zhang et al. | |

* cited by examiner

*Primary Examiner* — Ly D Pham
(74) *Attorney, Agent, or Firm* — Jaffery Watson Hamilton & DeSanctis LLP

(57) ABSTRACT

The present disclosure provides memristor-based crossbar circuits. A crossbar circuit may include a crossbar array of cross-point devices connecting to intersecting word lines and bit lines. The crossbar circuit further includes a first readout circuit configured to generate an output voltage representing a sum of currents flowing through a bit line connecting to one or more of the cross-point devices. The crossbar circuit further includes a voltage replica circuit connected to the first readout circuit. The voltage replica circuit includes a replica cell configured to produce a reference cell current, an operational amplifier, and a second readout circuit connected to the replica cell and the operational amplifier. The output of the operational amplifier is connected to the first readout circuit to provide a bias voltage to the first readout circuit.

15 Claims, 5 Drawing Sheets

VOLTAGE REPLICA CIRCUITS FOR RRAM-BASED CROSSBAR CIRCUITS

TECHNICAL FIELD

The implementations of the disclosure relate generally to electronic circuits and, more specifically, to voltage replica circuits for reading the stored value of a cell inside a crossbar array, such as resistive random-access memory (RRAM or ReRAM) devices.

BACKGROUND

A crossbar circuit may refer to a circuit structure with interconnecting electrically conductive lines sandwiching a memory element, such as a resistive switching material, at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, an apparatus is provided. The apparatus includes a crossbar array that includes a plurality of bit lines intersecting with a plurality of word lines; and a plurality of cross-point devices, wherein each of the plurality of cross-point devices is connected to at least one of the plurality of word lines and at least one of the plurality of bit lines. The apparatus further includes a first readout circuit configured to generate an output voltage representing a current or a sum of currents flowing through a bit line of the plurality of bit lines, and a voltage replica circuit connected to the first readout circuit. The voltage replica circuit includes a replica cell, an operational amplifier, and a second readout circuit connected to the replica cell and the operational amplifier. The current flowing through the replica cell corresponds to a reference cell current in the crossbar array. In some embodiments, the reference cell current represents at least one of the maximum cell current, an average cell current, or a current of a predetermined value. An output of the operational amplifier is connected to the first readout circuit to provide a bias voltage to the first readout circuit.

In some embodiments, the cross-point devices comprise at least one of a phase-change memory (PCM) device, a floating gate device, a spintronic device, a ferroelectric device, or a resistive random-access memory (RRAM) device.

In some embodiments, the replica cell comprises a resistive random-access memory (RRAM) device programmed to a target conductance of the plurality of the cross-point devices.

In some embodiments, the replica cell comprises a current sink configured to produce the reference cell current in the crossbar array.

In some embodiments, the replica cell comprises a resistor with a switch.

In some embodiments, the replica cell comprises a transistor biased to conduct the reference current.

In some embodiments, the second readout circuit is a replica of the first readout circuit.

In some embodiments, the first readout circuit comprises a first loading circuit and a first transistor. The output of the operational amplifier is connected to the first transistor.

In some embodiments, the second readout circuit comprises a second loading circuit and a second transistor. The second loading circuit is configured to generate a bias voltage for the first readout circuit, wherein the bias voltage enables an approximately constant output from the first readout circuit across variations in supply voltage and temperature.

In some embodiments, the first loading circuit comprises a resistor.

In some embodiments, the first loading circuit comprises a third transistor.

In some embodiments, the operational amplifier is configured in a closed-loop feedback configuration.

In some embodiments, the apparatus further includes an analog-to-digital converter configured to convert the output voltage into a digital signal.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Aspects of the disclosure provide read-out circuits for crossbar circuits including resistive random-access memory (RRAM or ReRAM) devices. A crossbar circuit may include intersecting electrically conductive wires (e.g., row lines, column lines, etc.) and cross-point devices arranged in one or more arrays. Each of the cross-point devices may be connected to a word line, a bit line, and a select line. The cross-point devices may include, for example, a phase-change memory (PCM) device, a floating gate device, a spintronic device, a ferroelectric device, an RRAM device, etc. The crossbar circuits may be used for multi-level memory (MLM) circuits and in-memory computing (IMC) circuits.

Crossbar circuits typically employ readout circuits to convert bit line current into voltage signals. It may be desirable to provide a bias voltage to such a readout circuit to ensure the bit line voltage does not exceed a certain limit, therefore preventing cell disturbance. Moreover, the application of bias voltage to the readout circuit may help maintain a read voltage that ensures the cell operates in a relatively linear region of its conductance with respect to the reading voltage. However, the ideal value of the bias voltage can vary significantly across Process, Voltage, and Temperature (PVT) corners. Using a simple bias voltage value can result in substantial changes to both the range of the output voltage and its linearity across these PVT variations.

The present disclosure provides a crossbar circuit including a voltage replica circuit configured to provide bias voltages to the readout circuit of the crossbar circuit. The voltage replica circuit may include a replica cell that emulates the behavior of a cross-point device in the crossbar circuit. The replica cell may include an RRAM device that is tuned to the highest conductance level specified by the operating specifications of the cross-point devices of the crossbar circuit. The voltage replica circuit utilizes a closed-loop scheme with an operational amplifier to read the current flowing through the replica cell. The output of the op-amp can be applied to the readout circuit of the crossbar circuit as a bias voltage. As long as the conductance of the cross-point devices in the crossbar circuit is less than or equal to that of the replica cell, the voltage output range of the cross-point devices may be the same as that of the replica cell. This may ensure accurate voltage readings, prevent cell disturbances, and ensure the linearity of the cross-point devices. Even though an op-amp is utilized to perform the voltage replica circuit's operations, a single op-amp may serve the entire crossbar circuit. Additionally, the settling time requirement for the op-amp is relaxed, as the conductance of the replica cell remains constant.

Figure 1:
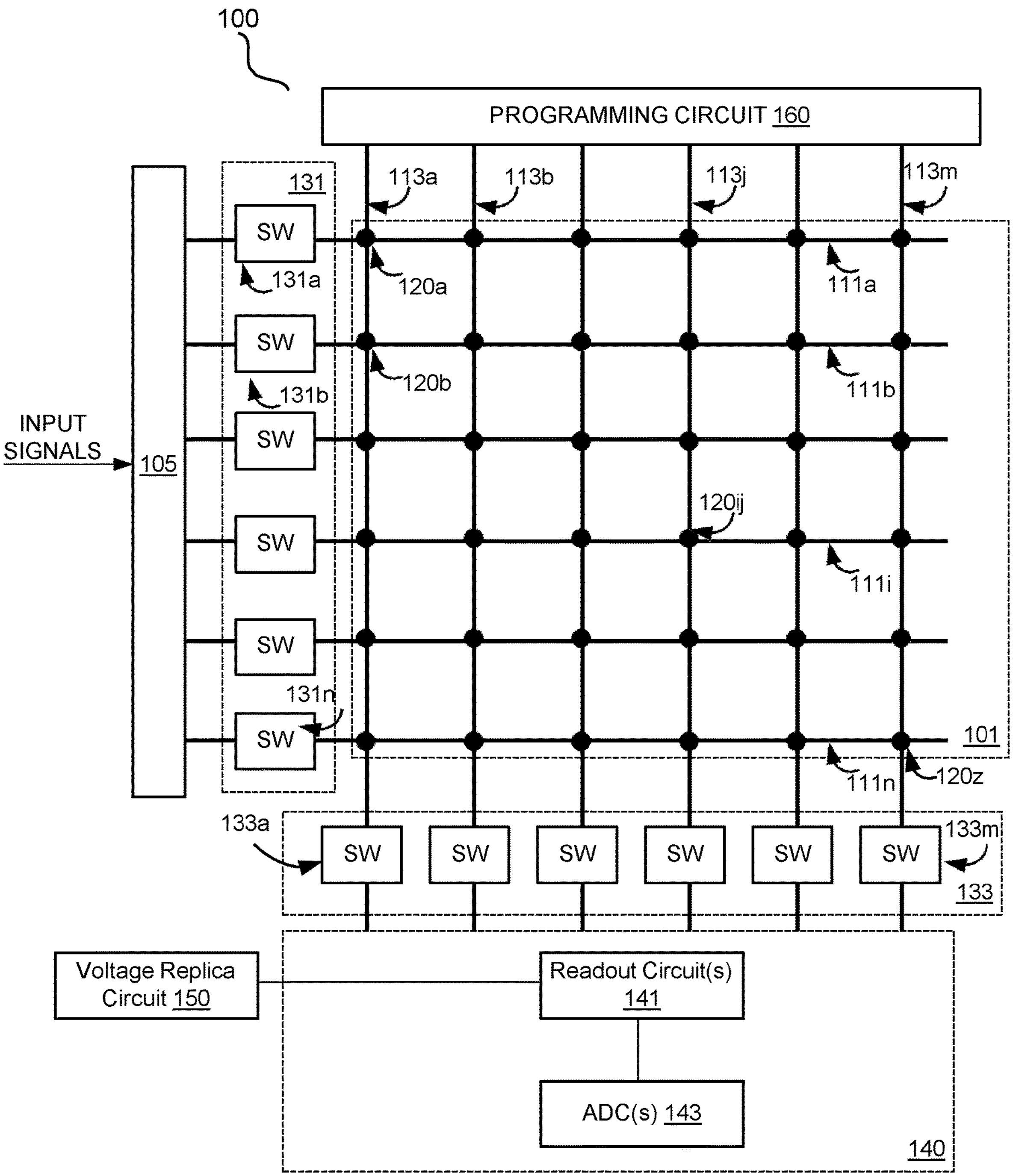
FIG. 1 is a diagram illustrating an example of a crossbar circuit in accordance with some embodiments of the present disclosure.

FIG. 1 is a diagram illustrating an example 100 of a crossbar circuit in accordance with some embodiments of the present disclosure. As shown, crossbar circuit 100 may include a plurality of interconnecting electrically conductive wires, such as one or more row wires 111*a*, 111*b*, . . . , 111*i*, . . . , 111*n*, and column wires 113*a*, 113*b*, . . . , 113*j*, . . . , 113*m* for an n-row by m-column crossbar array. The crossbar circuit 100 may further include cross-point devices 120*a*, 120*b*, . . . , 120*z*, etc. Each of the cross-point devices may connect a row wire and a column wire. For example, the cross-point device 120*ij* may connect the row wire 111*i* and the column wire 113*j*. The number of the column wires 113*a-m* and the number of the row wires 111*a-n* may or may not be the same. Crossbar circuit 100 may further include a word line (WL) logic 105 that is connected to the cross-point devices via the row wires 111*a-n*. The WL logic 105 may include any suitable component for applying input signals to selected cross-point devices via row wires 111*a-n*, such as one or more digital-to-analog converters (DACs), amplifiers, etc. Each of the input signals may be a voltage signal, a current signal, etc.

Row wires 111*a-n* may include a first row wire 111*a*, a second row wire 111*b*, . . . , 111*i*, . . . , and an n-th row wire 111*n*. Each of row wires 111*a*, . . . , 111*n* may be and/or include any suitable electrically conductive material. In some embodiments, each row wire 111*a-n* may be a metal wire.

Column wires 113*a*-113*m* may include a first column wire 113*a*, a second column wire 113*b*, . . . , and an m-th column wire 113*m*. Each column wire 113*a-m* may be and/or include any suitable electrically conductive material. In some embodiments, each column wire 113*a-m* may be a metal wire. In some embodiments, each row wire 111*a-n* is referred to as a word line, and each column wire 113*a-m* is referred to as a bit line.

Each cross-point device 120*a*-120*z* may be and/or include any suitable device with tunable resistance, such as phase-change memory (PCM) devices, floating gates, spintronic devices, ferroelectric devices, RRAM devices, etc.

Each row wire 111*a*-111*n* may be connected to one or more row switches 131 (e.g., row switches 131*a*, 131*b*, . . . , 131*n*). Each row switch 131 may include any suitable circuit structure that may control the current flowing through row wires 111*a*-111*n*. For example, row switches 131 may be and/or include a CMOS switch circuit.

Each column wire 113*a-m* may be connected to one or more column switches 133 (e.g., switches 133*a*, . . . , 133*m*). Each column switch 133*a*-133*m* may include any suitable circuit structure that may control current passing through column wires 113*a-m*. For example, column switches 133*a-m* may be and/or include a CMOS switch circuit. In some embodiments, one or more of switches 131*a-n* and 133*a-m* may further provide fault protection, electrostatic discharge (ESD) protection, noise reduction, and/or any other suitable function for one or more portions of crossbar circuit 100.

Output sensor(s) 140 may convert the current flowing through column wires 113*a-n* into the output signal. For example, output sensor(s) 140 may include one or more readout circuits 141. Each readout circuit 141 may convert the current flowing through a respective column wire into a respective voltage signal. Output sensor(s) 140 may further include one or more analog-to-digital converters (ADCs) 143 that may convert the voltage signal into a digital output. In some embodiments, output sensor(s) 140 may further include one or more multiplexers (not shown). Output sensor(s) 140 may include the output sensor 320 of FIG. 3. In some embodiments, the bit line current may be directly converted to a digital output without being converted to an intermediate voltage.

Crossbar circuit 100 may further include a voltage replica circuit 150 configured to provide clamping voltages to readout circuits 141 and/or output sensor(s) 140. Voltage replica circuit 150 may be and/or include a voltage replica circuit 330 as described in connection with FIG. 3 below. In some embodiments, a single voltage replica circuit 150 may provide camping voltages to multiple readout circuits 141. A single clamping voltage may be shared and utilized by multiple readout circuits 141 representative of multiple read channels.

Programming circuit 160 may program the cross-point devices 120*a-z* selected by switches 131 and/or 133 to suitable conductance values. For example, programming a cross-point device may involve applying a suitable voltage signal or current signal across the cross-point device. The resistance of each cross-point device may be electrically programmed. Setting a cross-point device may involve reducing the resistance of the cross-point device. Resetting the cross-point device may involve increasing the resistance of the cross-point.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance and generates a current from the cross-point device. By Kirchhoff's law, the sum of the currents passes through the activated cross-point devices on a respective column (also referred to as the "bit line current"), which may be read from the column. According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current (the "bit line current") is output via each column wire and may be accumulated according to Kirchhoff's current law. This may enable in-memory computing (IMC) via parallel multiplications and summations performed in the crossbar arrays.

Crossbar circuit 100 may be configured to perform vector-matrix multiplication (VMM). A VMM operation may be represented as Y=XA, wherein each of Y, X, A represents a respective matrix. More particularly, for example, input vector X may be mapped to the input voltage V of crossbar circuit 100. Matrix A may be mapped to conductance values G. The output current I may be read and mapped back to output results Y. In some embodiments, crossbar circuit 100 may be configured to implement a portion of a neural network by performing VMMs.

In some embodiments, crossbar circuit 100 may perform convolution operations. For example, performing 2D convolution on input data may involve applying a single convolution kernel to the input signals. Performing a depthwise convolution on the input data may involve convolving each channel of the input data with a respective kernel corresponding to the channel and stacking the convolved outputs together. The convolution kernel may have a particular size defined by multiple dimensions (e.g., a width, a height, a channel, etc.). The convolution kernel may be applied to a portion of the input data having the same size to produce an output. The output may be mapped to an element of the convolution result that is located at a position corresponding to the position of the portion of the input data.

Figure 2A:
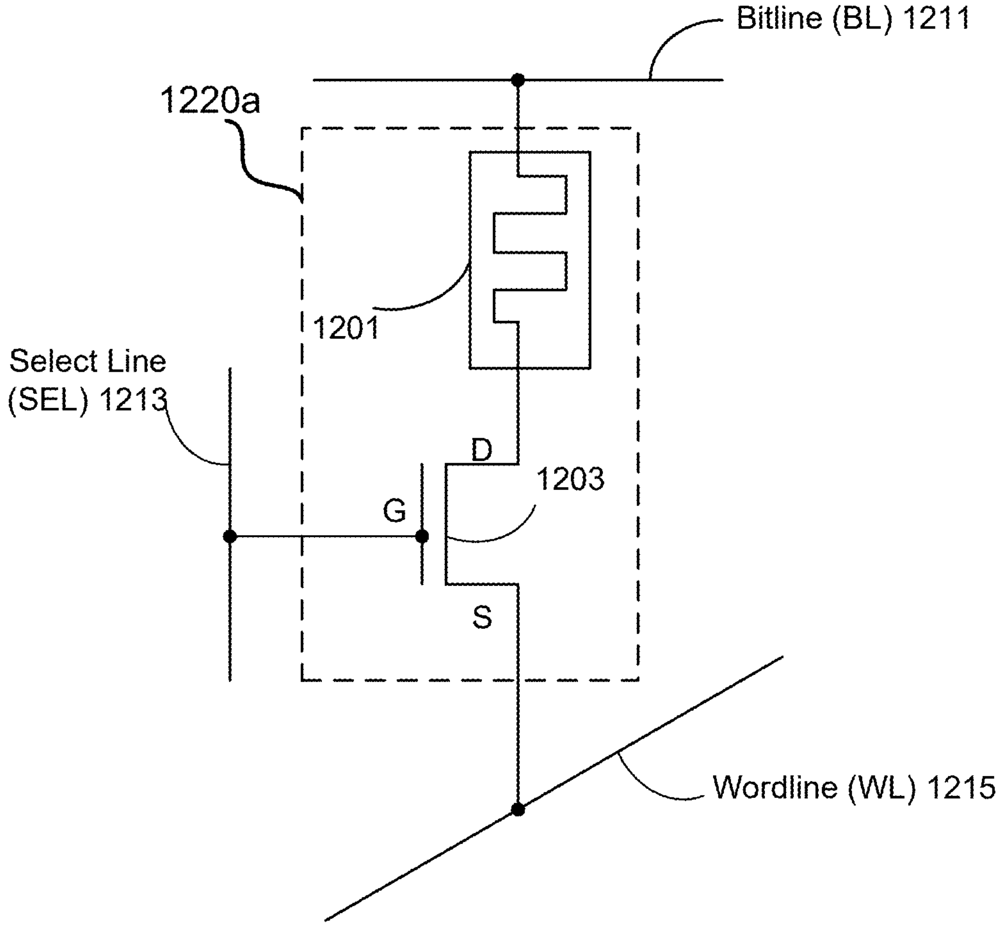
FIGS. 2A and 2B are schematic diagrams illustrating example cross-point devices in accordance with some embodiments of the present disclosure.
Figure 2B:
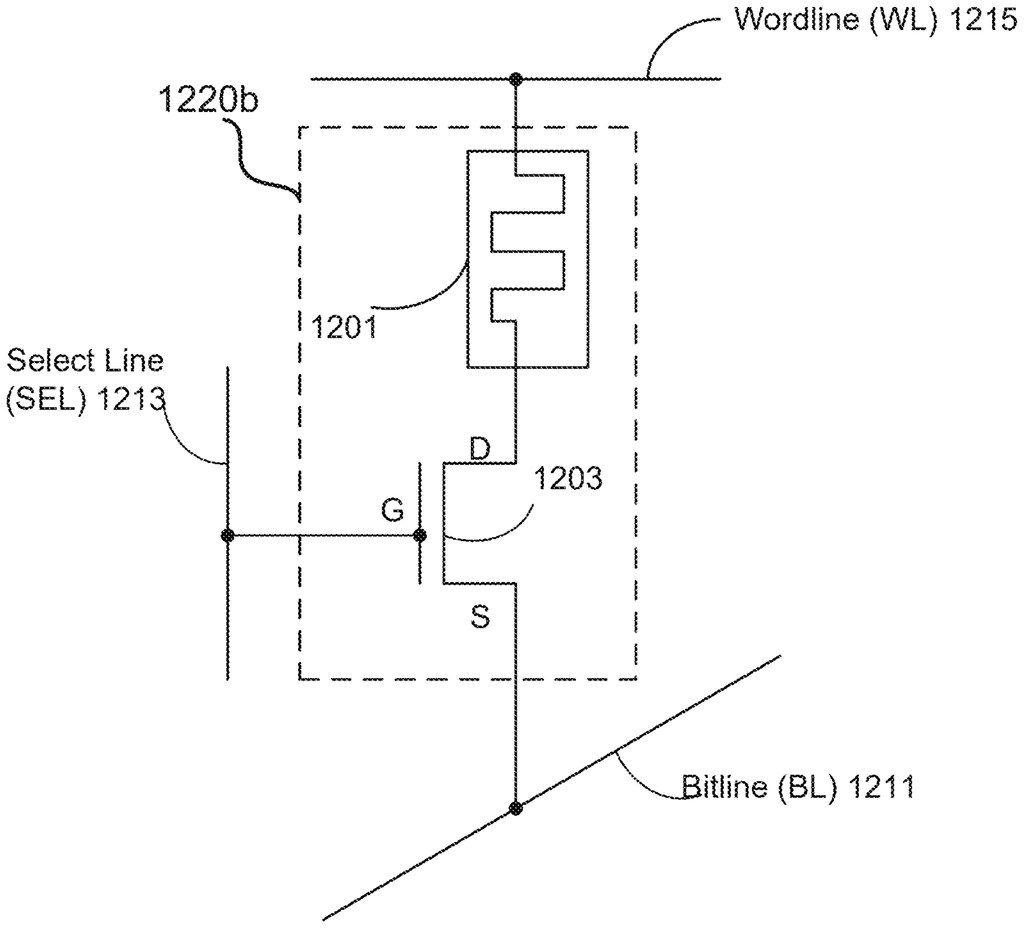

FIGS. 2A and 2B are schematic diagrams illustrating example cross-point devices 1220*a* and 1220*b* in accordance with some embodiments of the present disclosure. Cross-point device 1220*a* and cross-point device 1220*b* may be referred to as a 1-transistor-1-resistor (1T1R) configuration.

As shown in FIGS. 2A and 2B, a cross-point device 1220*a* or 1220*b* may include an RRAM device 1201 and a transistor 1203 that are connected in series. A transistor may include three terminals that may be marked as gate (G), source(S), and drain (D), respectively. Referring to FIG. 2A, the first terminal of RRAM device 1201 may be connected to the drain of transistor 1203. A second terminal of RRAM device 1201 may be connected to a bit line 1211. The source of the transistor 1203 may be connected to a word line 1215. The gate of transistor 1203 may be connected to a select line 1213.

As shown in FIG. 2B, the second terminal of RRAM device 1201 may be connected to the word line 1215, and the source of the transistor 1203 may be connected to a bit line 1211 in some embodiments. Word line 1215 may correspond to a row wire 111*a-n* of FIG. 1. Bit line 1211 may correspond to a column wire 123*a-m* of FIG. 1.

Transistor 1203 may function as a selector as well as a current controller and may set the current compliance to RRAM device 1201 during programming. The gate voltage on transistor 1203 can set current compliances to cross-point device 1220*a-b* during programming and can thus control the conductance and analog behavior of cross-point device 1220*a-b*. For example, when cross-point device 1220*a-b* is set from a high-resistance state to a low-resistance state, a set signal (e.g., a voltage signal, a current signal) may be provided via bit line (BL) 1211 or word line (WL) 1215. Another voltage, also referred to as a select voltage or gate voltage, may be applied via select line (SEL) 1213 to the transistor gate to open the gate and set the current compliance, while word line (WL) 1215 or bit line (BL) 1211 may be grounded. When cross-point device 1220*a-b* is reset from the low-resistance state to the high-resistance state, a gate voltage may be applied to the gate of transistor 1203 via select line 1213 to open the transistor gate. Meanwhile, a reset signal may be sent to RRAM device 1201 via word line 1215 or bit line 1211, while bit line 1211 or word line 1215 may be grounded.

Figure 3:
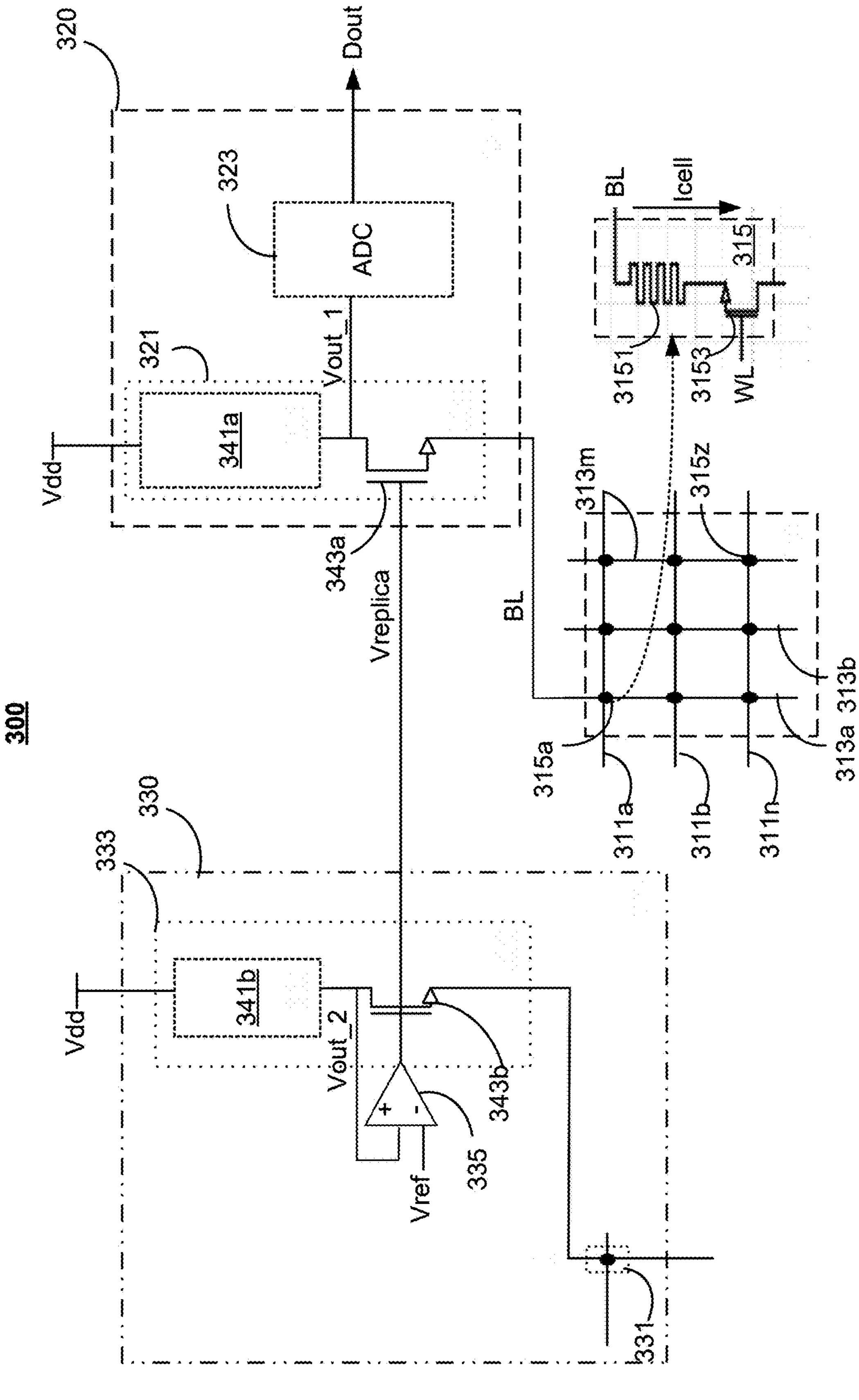
FIG. 3 is a circuit diagram illustrating an example crossbar circuit in accordance with some implementations of the present disclosure.

FIG. 3 is a circuit diagram illustrating an example 300 of a crossbar circuit in accordance with some implementations of the present disclosure.

As shown, crossbar circuit 300 may include a crossbar array 310 that includes a plurality of bit lines 313*a*, 313*b*, . . . , 313*m* that intersect with a plurality of word lines 311*a*, 311*b*, . . . , 311*n*, and a plurality of cross-point devices 315*a*, . . . , 315*z*. Each of the cross-point devices is connected to a word line 311*a-n* and a bit line 313*a-m*. Crossbar array 310 may be and/or include the crossbar array 101 of FIG. 1. While a certain number of cross-point devices are shown in FIG. 3, this is merely illustrative. Crossbar array 310 may include any suitable number of cross-point devices. In some embodiments, one or more cross-point devices 315*a*-315*z* may include a 1T1R configuration as described in connection with FIGS. 2A and 2B, such as a cross-point device 315 including an RRAM device 3151 and a transistor 3153 that are serially connected to each other. The current flowing through cross-point device 315 is referred to (as the "cell current" or Icell).

Crossbar circuit 300 may include an output sensor 320 configured to generate a digital output Dout representative of the sum of currents flowing through one or more bit lines 313*a-m*. Output sensor 320 may include a first readout circuit 321 and an analog-to-digital converter (ADC) 323. First readout circuit 321 may be configured to produce an output voltage Vout_1 (also referred to as the "first output voltage") that represents the sum of currents flowing through a bit line 313*a-m* that is connected to first readout circuit 321. First readout circuit 321 may include a loading circuit 341*a* (also referred to as the "first loading circuit") and a transistor 343*a* (also referred to as the "first transistor"). In some embodiments, loading circuit 341*a* may include one or more passive resistors, adaptive resistors, transistors, diodes, and/or any other suitable components for providing a suitable electrical load. Loading circuit 341*a* may be connected to a supply voltage Vdd. ADC 323 may convert the output voltage Vout_1 into a digital output Dout.

Crossbar circuit 300 may further include a voltage replica circuit 330 configured to provide a bias voltage to first readout circuit 321 and/or output sensor 320. Voltage replica circuit 330 may include a replica cell 331, a second readout circuit 333, and an operational amplifier (op-amp) 335. Replica cell 331 may operate similarly to a standard memory device by having terminal connections to a word line (WL) and a bit line (BL). Second readout circuit 333 may be connected to the bit line BL.

Replica cell 331 may include any suitable component for emulating the behavior of a cross-point device in crossbar array 310 and producing a reference cell current (also referred to as Icell_ref). The reference cell current may be the current flowing through a cross-point device that is programmed to a target conductance of cross-point devices 315*a-z*. The reference cell current may be the maximum cell current in the crossbar array 310, an average cell current in the crossbar array 310, a current of a predetermined value, or a current of any other suitable value. For example, replica cell 331 may include a cross-point device as described herein. The cross-point device may include an RRAM device that is programmed to the maximum designed conductance. In some embodiments, replica cell 331 may include a 1T1R configuration as described in connection with FIGS. 2A-2B above. As another example, replica cell 331 may include a current sink configured to produce the reference cell current. In some embodiments, replica cell 331 may include one or more replica cells as described in connection with FIGS. 4A-4C below.

Second readout circuit 333 may produce an output voltage Vout_2 (also referred to as the "second output voltage") representative of the current flowing through replica cell 331 (e.g., the reference cell current). Second readout circuit 333 may include a loading circuit 341*b* (also referred to as the "second loading circuit") and a transistor 343*b* (also referred to as the "second transistor"). In some embodiments, loading circuit 341*b* may include one or more passive resistors, adaptive resistors, transistors, diodes, and/or any other suitable components for providing a suitable electrical load. Loading circuit 341*b* may be connected to the supply voltage Vdd.

Voltage replica circuit 330 may be configured to read the current flowing through replica cell 331 with a closed loop scheme using op-amp 335. An input of op-amp 335 may be connected to a second readout circuit 333 to form a feedback configuration. In particular, the output voltage Vout_2 may be applied to the input of op-amp 335. The output of op-amp 335 may be provided to the first readout circuit 321, and connected to the gate of transistor 343*a* as a bias voltage, Vreplica. As the current flowing through the replica cell represents the reference cell current in crossbar array 310, the replica voltage corresponds to the reference cell current. In some embodiments in which replica cell 331 includes a cross-point device, as long as the conductance of the cross-point devices in crossbar array 310 is within the conductance range of replica cell 331, the cross-point devices in crossbar array 310 may have the same voltage output range as replica cell 331. In some implementations, replica circuit 330 may include additional drivers for producing the bias voltage Vreplica.

In some embodiments, a single voltage replica circuit 330 may provide a bias voltage Vreplica to multiple readout circuits 320 in a crossbar circuit. A single bias voltage may be shared and utilized by multiple readout circuits 320 representative of multiple read channels. Each of the read channels may correspond to a bit line 313*a*, . . . , 313*m*. In the case that a voltage replica circuit 330 does not have sufficient drive strength to drive a certain number of readout circuits 320, the bias voltage Vreplica may be buffered to improve the settling time.

Figures 4A, 4B, 4C:
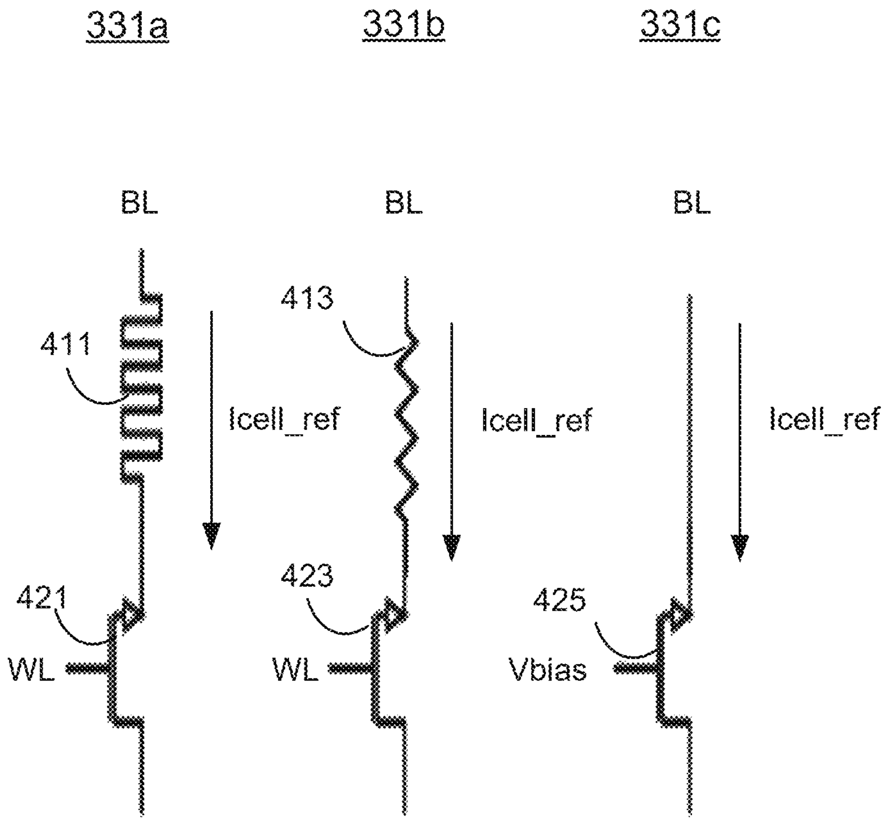
FIGS. 4A, 4B, and 4C are schematic diagrams illustrating example replica cells in accordance with some embodiments of the present disclosure.

FIGS. 4A, 4B, and 4C are schematic diagrams illustrating examples 331*a*, 331*b*, and 331*c* of replica cells in accordance with some embodiments of the present disclosure.

As shown in FIG. 4A, replica cell 331*a* may include an RRAM device 411 serially connected to a transistor 421. As shown in FIG. 4B, replica cell 331*b* may include a resistor 413 serially connected to a transistor 423. As shown in FIG. 4C, replica cell 331*c* may include a transistor 425 biased to conduct the reference current. As illustrated, each replica cell 331*a* and 331*b* may be connected between a word line WL and a bit line BL. Replica cell 331*c* may be connected between a bias signal Vbias and a bit line BL. The current flowing through each replica cell 331*a*, 331*b*, and 331*c* may be the reference cell current Icell_ref.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, the use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:
a crossbar array comprising:
a plurality of bit lines intersecting with a plurality of word lines; and
a plurality of cross-point devices, wherein each of the plurality of cross-point devices is connected to at least one of the plurality of word lines and at least one of the plurality of bit lines;
a first readout circuit configured to generate an output voltage representing a current or a sum of currents flowing through a bit line of the plurality of bit lines; and
a voltage replica circuit connected to the first readout circuit, the voltage replica circuit comprising:
a replica cell, wherein a current flowing through the replica cell corresponds to a reference cell current;
an operational amplifier, wherein an output of the operational amplifier is connected to the first readout circuit to provide a bias voltage to the first readout circuit; and
a second readout circuit connected to the replica cell and the operational amplifier.

2. The apparatus of claim 1, wherein the cross-point devices comprise at least one of a phase-change memory (PCM) device, a floating gate device, a spintronic device, a ferroelectric device, or a resistive random-access memory (RRAM) device.

3. The apparatus of claim 1, wherein the replica cell comprises a resistive random-access memory (RRAM) device programmed to a target conductance of the plurality of cross-point devices.

4. The apparatus of claim 1, wherein the replica cell comprises a current sink configured to produce the reference cell current in the crossbar array.

5. The apparatus of claim 1, wherein the replica cell comprises a resistor with a switch.

6. The apparatus of claim 1, wherein the replica cell comprises a transistor biased to conduct the reference current.

7. The apparatus of claim 1, wherein the second readout circuit is a replica of the first readout circuit.

8. The apparatus of claim 7, wherein the first readout circuit comprises a first loading circuit and a first transistor, and wherein the output of the operational amplifier is connected to the first transistor.

9. The apparatus of claim 8, wherein the second readout circuit comprises a second loading circuit and a second transistor, wherein the second loading circuit is configured to generate the bias voltage for the first readout circuit, wherein the bias voltage enables an approximately constant output from the first readout circuit across variations in supply voltage and temperature.

10. The apparatus of claim 9, wherein the first loading circuit comprises a resistor.

11. The apparatus of claim 10, wherein the first loading circuit comprises a third transistor.

12. The apparatus of claim 1, wherein the operational amplifier is configured in a closed-loop feedback configuration.

13. The apparatus of claim 1, further comprising an analog-to-digital converter configured to convert the output voltage into a digital signal.

14. The apparatus of claim 1, wherein the reference cell current represents at least one of the maximum cell current or an average cell current in the crossbar array.

15. The apparatus of claim 1, wherein the reference cell current represents a cell current of a predetermined value.

* * * * *